United States Patent
Kalte et al.

(10) Patent No.: US 9,870,440 B2
(45) Date of Patent: Jan. 16, 2018

(54) METHOD FOR AUTOMATICALLY GENERATING A NETLIST OF AN FPGA PROGRAM

(71) Applicant: dSPACE digital signal processing and control engineering GmbH, Paderborn (DE)

(72) Inventors: Heiko Kalte, Paderborn (DE); Dominik Lubeley, Verl (DE)

(73) Assignee: dSPACE digital signal processing and control engineering GmbH, Paderborn (DE)

(*) Notice: Subject to any disclaimer, the term of this patent is extended or adjusted under 35 U.S.C. 154(b) by 0 days.

(21) Appl. No.: 14/711,116

(22) Filed: May 13, 2015

(65) Prior Publication Data

US 2015/0331983 A1 Nov. 19, 2015

(30) Foreign Application Priority Data

May 13, 2014 (EP) .................................... 14168015
Apr. 28, 2015 (EP) .................................... 15165320

(51) Int. Cl.
*G06F 17/50* (2006.01)
(52) U.S. Cl.
CPC ................................ *G06F 17/5054* (2013.01)
(58) Field of Classification Search
CPC ........... G06F 17/5068; G06F 15/17362; G06F 17/5072; G06F 17/5081; G06F 17/5045; G06F 17/505; G06F 17/5009

USPC .................. 716/104, 105, 124–125, 131–132
See application file for complete search history.

(56) References Cited

U.S. PATENT DOCUMENTS

| | | | | |
|---|---|---|---|---|
| 6,080,204 | A | * | 6/2000 | Mendel ............... G06F 17/5054 716/103 |
| 7,203,630 | B2 | | 4/2007 | Kolb et al. |
| 7,464,362 | B1 | | 12/2008 | Borer et al. |
| 7,669,157 | B1 | * | 2/2010 | Borer .................... G06F 17/505 703/22 |
| 8,407,645 | B1 | | 3/2013 | Caranci et al. |
| 2010/0138389 | A1 | | 6/2010 | Snapp |

FOREIGN PATENT DOCUMENTS

WO    WO 01/45258 A2    6/2001
WO    WO 2004/045106    5/2004

OTHER PUBLICATIONS

Extended European Search Report for European Application No. 14168015.7 dated Sep. 25, 2014 with English translation.

(Continued)

*Primary Examiner* — Nghia Doan
(74) *Attorney, Agent, or Firm* — Muncy, Geissler, Olds & Lowe, P.C.

(57) ABSTRACT

A method for generating a netlist of an FPGA program. The model of the FPGA program is composed of at least two components, each component being assigned a separate partition on the FPGA. An independent build is carried out for each component and an overall classification is generated from the components, wherein the build jobs are automatically started after a trigger event and the trigger event is a saving of a component, the exiting of a component of the design, or a time-controlled, automated initiation of a build.

21 Claims, 12 Drawing Sheets

(56) References Cited

OTHER PUBLICATIONS

"Vivado Design Suite Tutorial: Hierarchical Design", XLINX, pp. 1-25 (Oct. 30, 2013).
"Vivado Design Suite User Guide: Hierarchical Design," XLINX, pp. 1-22 (Jan. 6, 2014).
Navaratnasothie Selvakkumaran, "Scalable Partitioning-Driven Algorithms for Solving Complex and Emerging Problems in VLSI Physical Design Automation," Dissertation for Univ. of Minnesota, pp. 1-144 (Jun. 2005).
Beckhoff et al., "GOAHEAD: A Partial Reconfiguration Framework," Dept. of Informatics, Univ. of Oslo, Norway, pp. 1-8.
"NI LabVIEW FPGA Compile Farm Toolkit," National Instruments, p. 1 (2014).
Altera, "15: Best Practices for Incremental Compilation Partitions and Floorplan Assignments," Quartus II Handbook Ver. 13.1, vol. 1: Design and Synthesis, pp. 15-1-15-54 (Nov. 2013).
Office Action for European Patent Application No. 15 165 320.1 dated Nov. 18, 2016 with English translation.
"Visual studio SKD—Trading file Saving event—stack Overflow", p. 1 (Mar. 23, 2012).
"dp-connect", pp. 1-4 (Jun. 17, 2006).
"Of Jenkins users—Build on a specific date / time trigger", pp. 1-2 (Sep. 16, 2006).
European Office Action for European Application No. 14168015.7 dated Jul. 14, 2016 with English translation.
XLINX, "Using Vivado Design Suite with Version Control Systems," at http://www.xlinx.com/support/documentation/application_notes/xapp1165.pdf, pp. 1-22 (Aug. 5, 2013).
European Office Action for European Application No. 15165320.1 dated Mar. 31, 2017.
European Office Action for European Application No. 14168015.7 dated Apr. 6, 2017 with English translation.
Mohammad Tehranipoor, "CAD Algorithms Partitioning," at http://www.engr.uconn.edu/~tehrani/teaching/cad/13_partitioning.pdf, pp. 1-22 (Oct. 13, 2008).
European Office Action for European Application No. 15165320.1 dated Jun. 28, 2017 with English translation.
Xlinx, "Vivado Design Suite User Guide: Implementation," pp. 1-71 (Dec. 18, 2012).

* cited by examiner

METHOD FOR AUTOMATICALLY GENERATING A NETLIST OF AN FPGA PROGRAM

This nonprovisional application claims priority under 35 U.S.C. §119(a) to European Patent Application Nos. EP 14168015.7, which was filed on May 13, 2014 and to EP 15165320.1, which was filed on Apr. 28, 2015, and which are both herein incorporated by reference.

BACKGROUND OF THE INVENTION

Field of the Invention

The present invention relates to a method for automatically generating a netlist of an FPGA (Field Programmable Gate Array) program.

Description of the Background Art

In the conventional art, an FPGA program is compiled in an abstract development environment. This permits the users to develop an FPGA program even without detailed knowledge about FPGAs and tool flows. One example of such a development environment is the program "Simulink" by the company The Mathworks in connection with the program "System Generator for DSP" by the company Xilinx. A model of the FPGA program is produced in such a development environment. Testing the model that has been produced requires a build of a netlist for the configuration of an FPGA based on the model of the FPGA program. Typically, an FPGA build includes the steps of synthesis, placement, and routing. The netlist that has been prepared in this way is then used to produce a bit stream for the configuration of the FPGA. The process of the build, however, lasts for a comparatively long time so that when there are frequent changes to the model of the FPGA program, this results in long wait times.

In other words, to define the behavior of the FPGA, the user provides a hardware description language (HDL) or a schematic design. The HDL form is more suited to work with large structures because it's possible to just specify them numerically rather than having to draw every piece by hand. However, schematic entry can allow for easier visualisation of a design. Then, using an electronic design automation tool, a technology-mapped netlist is generated. The netlist can then be fitted to the actual FPGA architecture using a process called place-and-route, usually performed by the FPGA company's proprietary place-and-route software. The user will validate the map, place and route results via timing analysis, simulation, and other verification methodologies. Once the design and validation process is complete, the binary file generated (also using the FPGA company's proprietary software) is used to (re)configure the FPGA. This file is transferred to the FPGA/CPLD via a serial interface (JTAG) or to an external memory device like an EEPROM.

In order to reduce the time required until a completely placed and routed netlist is available after completion of the modeling, it is known to manually divide the model into components, to manually partition an FPGA, to synthesize each of the components individually, and to place and route them appropriately for a partition. During the complete build for the whole model, the already placed and routed netlists of the components are simply accepted unchanged and the connections between the components are produced as needed. This approach can be implemented using the tool flow that Xilinx refers to as "hierarchical tool flow." The partitioning of an FPGA is also referred to as floor-planning.

U.S. Pat. No. 8,407,645, which is incorporated herein by reference, discloses the division of a model and the separate building of individual components.

SUMMARY OF THE INVENTION

It is therefore an object of the present invention to improve the conventional art. Based on the above-mentioned hierarchical tool flow, the most up-to-date possible netlists of components and FPGA-overall classifications should be maintained for the user at all times. The complete build known from the conventional art, in which all of the components are always subject to a new synthesis, placement, and routing, is not efficient and is not practicable in the rapid control prototyping environment. The method described in this invention improves the hierarchical tool flow. The method makes use of the hierarchical tool flow and enhances it by means of additional steps. These steps, which are used individually or in combination in this method, include the following:

1. Automated FPGA prebuild: The individual components are rebuilt, i.e. synthesized, and if need be placed and routed automatically in the background so that they can be immediately used if necessary. To this end, a job queuer recognizes triggers and initiates the build of components. In a preferred variant, overall classifications, i.e. complete netlists of the model or bit streams generated from the netlists for the configuration of an FPGA, are likewise prepared automatically by means of a prebuild. In an embodiment, the automatic building of components and overall classifications is distributed over a plurality of processor cores. These processor cores can be located in the same computer or can be connected via a network.

2. Automatic versioning: The individual components are versioned automatically together with the netlists so that when a change to an old component version is made, complete netlists of the component are available. The version change is implicitly recognized by comparing current component versions to already versioned classifications.

3. Automatic modularization: Model/code hierarchies that are excessively flat are automatically divided into smaller components. Smaller components can generally be built more quickly and replaced more easily.

4. Automatic floor-planning: For the components, regions in the FPGA are automatically reserved for the implementation according to various criteria such as the resource demand of the components or the data exchange of the components with one another. For components between which no direct data exchange occurs, it is possible, for example, to reserve regions of the FPGA that are spatially remote from each other.

5. Use of an already existing overall classification in order, in the event of a change in a component, to update this in the existing overall classification. In this way, it is possible to achieve a new overall classification when the component is changed.

6. Enhanced FPGA build job queuer: FPGA build jobs are transmitted to an enhanced job queuer. The latter divides jobs among various resources that are available to it, such as free cores, a build farm, or a build cloud. Compared to normal job queuers, the enhanced job queuer recognizes not only the priorities of build jobs, but also their dependencies. An up-to-date overall classification can be provided more quickly through continuous monitoring, resource allocation, and resource removal.

By means of the above-mentioned steps, it is possible to produce a complete netlist of the FPGA program much more quickly. Individual components can be interchanged according to the modular design principle and through partial reconfiguration, can even be inserted into the FPGA in online fashion while the latter is running.

The more parallel computing power is available, the more up-to-date the user is able to keep the overall classifications or netlists of individual components during the ongoing modeling. To that end, one embodiment of the invention includes an enhanced job queuer, which starts FPGA build jobs for the individual components and for an overall classification in a priority-based fashion. The enhanced job queuer can distribute jobs by priority to a plurality of cores, FPGA build farms, and clouds. In addition, the jobs can be subsequently reweighted and/or aborted, for example if a synthesis that was started automatically has to be interrupted because the user has made further changes to the component.

In an embodiment, the invention relates to a method for generating a netlist of an FPGA program; the underlying model of the FPGA program is composed of at least two components; each component is assigned a separate partition on the FPGA; an independent build of a netlist is carried out for each component and the build jobs are automatically started by a job queuer after a trigger; an overall classification is generated from the netlists of the components; the build jobs are automatically started after a trigger event; and the trigger event is a saving of a component, the exiting of a component of the model, or a time-controlled, automated initiation of a build.

An advantage of the invention is that netlists of components and overall classifications can be made available more quickly because there is no waiting until the user initiates the build of components and overall classifications. Instead, during the creation or modification of the model by the user, a build is initiated automatically. Thus for example after the saving of a component, a build can be automatically initiated for this component or, if the user exits a component in the modeling environment, e.g. closes an editing window, a build can be automatically initiated for this component. An overall classification is a placed and routed netlist of the complete FPGA model. A bit stream for the configuration of an FPGA can be produced from an overall classification.

In an embodiment of the invention, the netlists of the components can be versioned automatically.

An advantage of the versioning is that in the event of a change to an old component version, completed netlists of the component can be recognized and used. The netlists in this case can be unplaced netlists, placed netlists, or routed netlists.

In an embodiment of the invention, the model of the FPGA program can be automatically divided into a plurality of components.

An advantage of the automated division is that the user is freed of this task and the components can be built independently of one another and in parallel. The independence permits a component to already be being built while the user is making changes to another component. The parallel operation permits build jobs to be executed simultaneously with different build resources.

For a model that is composed of a plurality of submodels, the automated division can include the use of submodels as components. Likewise, submodels that are composed of a plurality of sub-submodels can be divided into these sub-submodels in order to obtain more and smaller components. The use of the division of the model into submodels as a basis for the division makes it very easy to automate the division. Another approach is the mapping of the model on a graph or hypergraph. Such a mapping is possible, for example, when the model exists in the form of a netlist. Then, the logic cells of the netlist are mapped at the nodes of the graph and the connections are mapped at the edges of the graph. After the mapping, algorithms can be used for the division of graphs and hypergraphs. In a graphic model, the blocks can be mapped at the nodes and the connections can be mapped at the edges. In general, a model can be divided into components at arbitrary boundaries. It is thus possible for graphic models to be divided at connections between blocks or for VHDL models to be divided into groups of entities or into individual entities. A division into more and smaller components increases the possible degree of parallelism of the build jobs, but by contrast reduces the possibilities for the overarching optimization since each component can only be optimized in and of itself.

In an embodiment of the invention, the FPGA can be automatically divided into a number of partitions, which corresponds to the number of components of the model of the FPGA program and in which the components are automatically allocated to the partitions. The logic cells, for example, correspond to logical circuit components of the FPGA and the netlist corresponding to wired interconnects between circuit components of the FPGA.

An advantage of the automated division of the FPGA and the automated allocation of the components to the partitions is that the partitioning and allocation can be repeated automatically at any time and can thus be changed. When changes are made to the components that cause the resource demand of the netlist to exceed the resource supply of the allocated partition, then the floorplan is automatically adapted by means of a new partitioning, thus enabling an automated build.

In an embodiment of the invention, a first partition is reduced in size and a portion that is not needed by the built form of the component, which is allocated to the first partition, is allocated to a second partition.

One advantage of the reduction in size is that partitions reserve as little unused space as possible. If after the build, the regions used by the component remain unchanged, then unused regions can be allocated to other partitions.

In an embodiment of the invention, a third partition and a fourth partition can be combined to form a fifth partition and the components allocated to the third partition and fourth partition are combined.

An advantage of the combining is that for the tools that produce the configuration bit stream from the model components, more optimization possibilities are available if the model components are not divided into subcomponents. The combining thus makes it possible to achieve a more highly optimized configuration, i.e. the program can be executed more quickly on the FPGA, for example because the FPGA can be operated at a faster clock cycle and/or because fewer elements of the FPGA are required for the program.

In an embodiment of the invention, an overall classification can be automatically built as soon as netlists of all components of the model are available in a routed form.

An advantage of the automated building of an overall classification is that an overall classification is available early and in many cases, the overall classification can to a large extent continue to be used when changes to components are made.

In an embodiment of the invention, if an overall classification is already available when a change to a component is made, then the changed component can be updated in the overall classification when a new overall classification is built.

An advantage of updating only the changed components of an existing overall classification is that it takes significantly less time for the build tools to update components in an overall classification than to generate an overall classification from the whole model/whole source code. Thus, the whole floorplan or FPGA logic array need not be rewritten every time a component is updated. Instead, updates are made only to the hardware logic affected by the change.

In an embodiment of the invention, the completed built overall classifications can be automatically versioned.

An advantage of the versioning is that when a change to an old version of the model is made, a completed overall classification belonging to the version can be recognized and used.

In an embodiment of the invention, the build jobs can be managed by an enhanced job queuer.

An advantage of the enhanced job queuer is that it starts FPGA build jobs for the individual components and also for an overall classification in a priority-based fashion. The enhanced job queuer can distribute jobs in a prioritized fashion to a plurality of cores, FPGA build farms, and clouds. In addition, the jobs can be subsequently reweighted and/or aborted, for example if an automatically started synthesis has to be interrupted because the user has made other changes to the component.

The invention also relates to a development environment for an FPGA program, which performs a method according to the invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
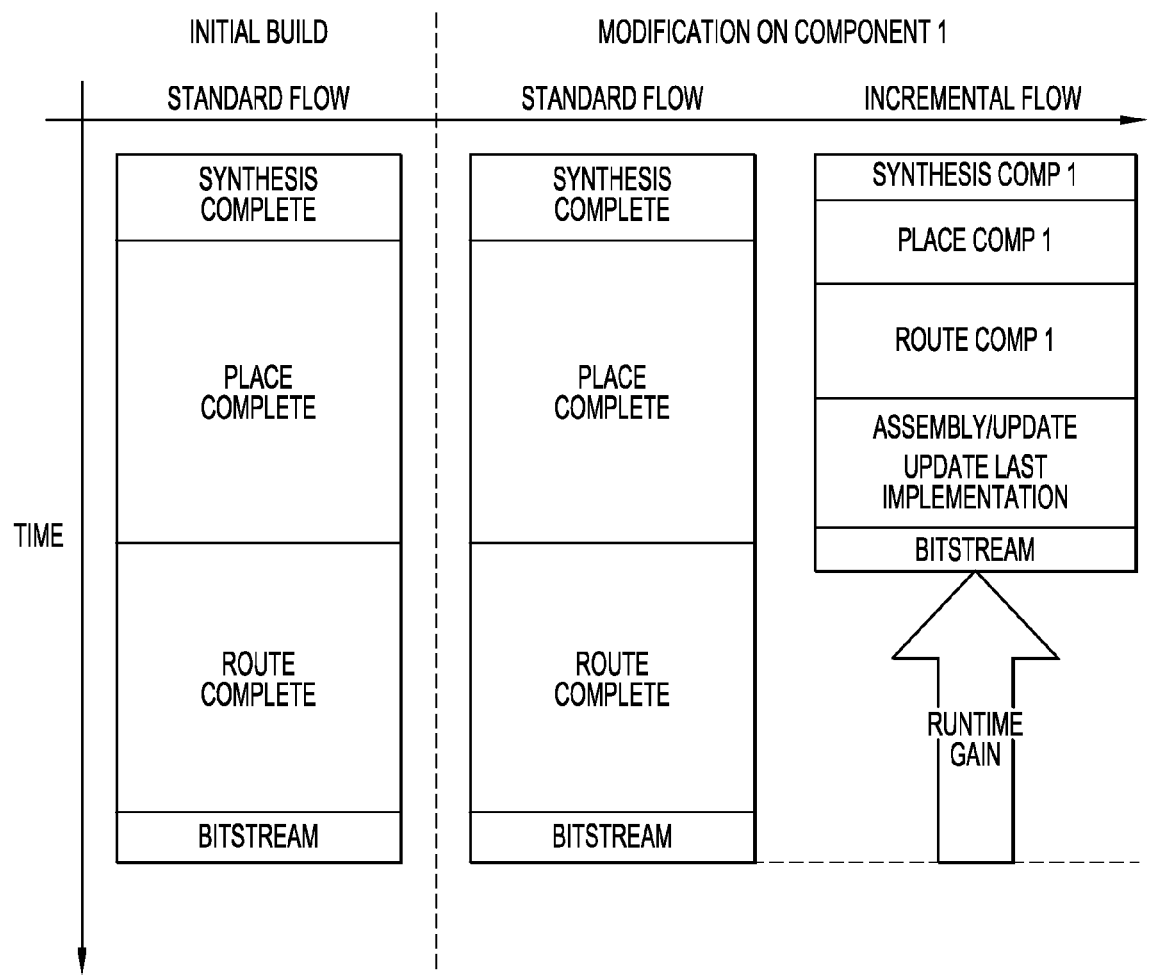
FIG. 1 shows a variation over time of an initial FPGA build and the qualitative time savings when a change to a component occurs.

FIG. 1 shows the variation over time of an initial FPGA build and the qualitative time savings when a change to a component occurs. The normal sequence of an initial build is shown on the left side. In the normal sequence, first a synthesis of the entire FPGA model is carried out. The synthesized components of the model are then placed on the logic blocks of the FPGA. Then, the signal lines between the components are routed. The bit stream for the configuration of the FPGA is then produced based on the totality of the components and signal lines. This sequence does not have to be carried out with each change to the model/source code. The normal sequence is only carried out with the first build. When changes to an individual component are made, then only this individual component is resynthesized, placed and routed, and combined with the already completed netlists of components of the FPGA program. A build of the complete FPGA program therefore takes less time since many components are already complete and the whole model is not synthesized, placed, and routed all over again. Then a bit stream for the whole model is produced.

Figure 2:
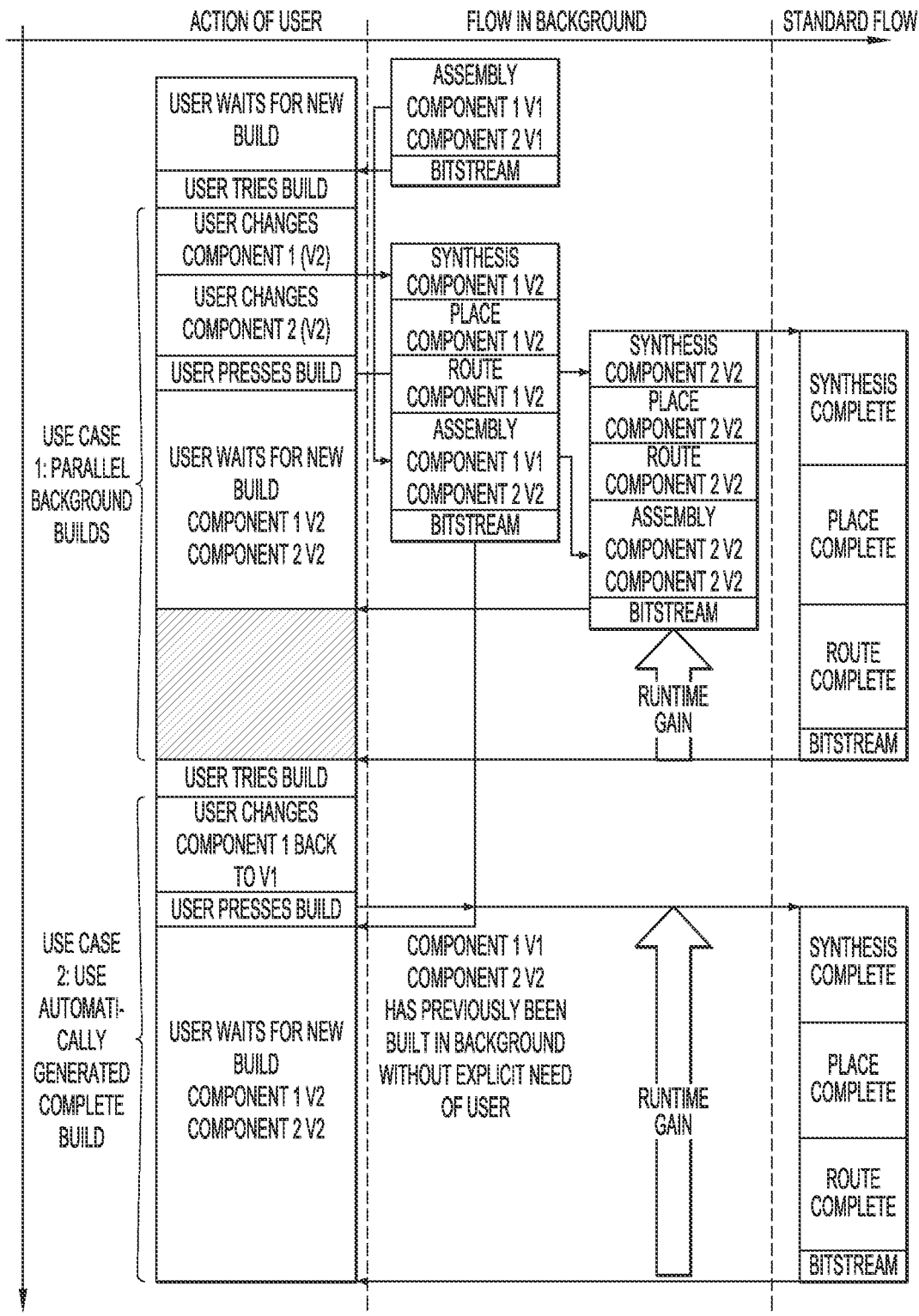
FIG. 2 shows two applications of the method according to an embodiment of the invention.

FIG. 2 shows two important applications of the invention. On the one hand, this is the automatic, parallel generation of component classifications and overall classifications so that when the user issues a build request, an overall classification can be made available very quickly (use case 1). On the other hand, other combinations of component versions are continuously built in the background so that for example when a component is turned back to an old version, the customer can obtain an overall classification immediately if need be (use case 2) because this already exists without his knowledge.

Figure 3:
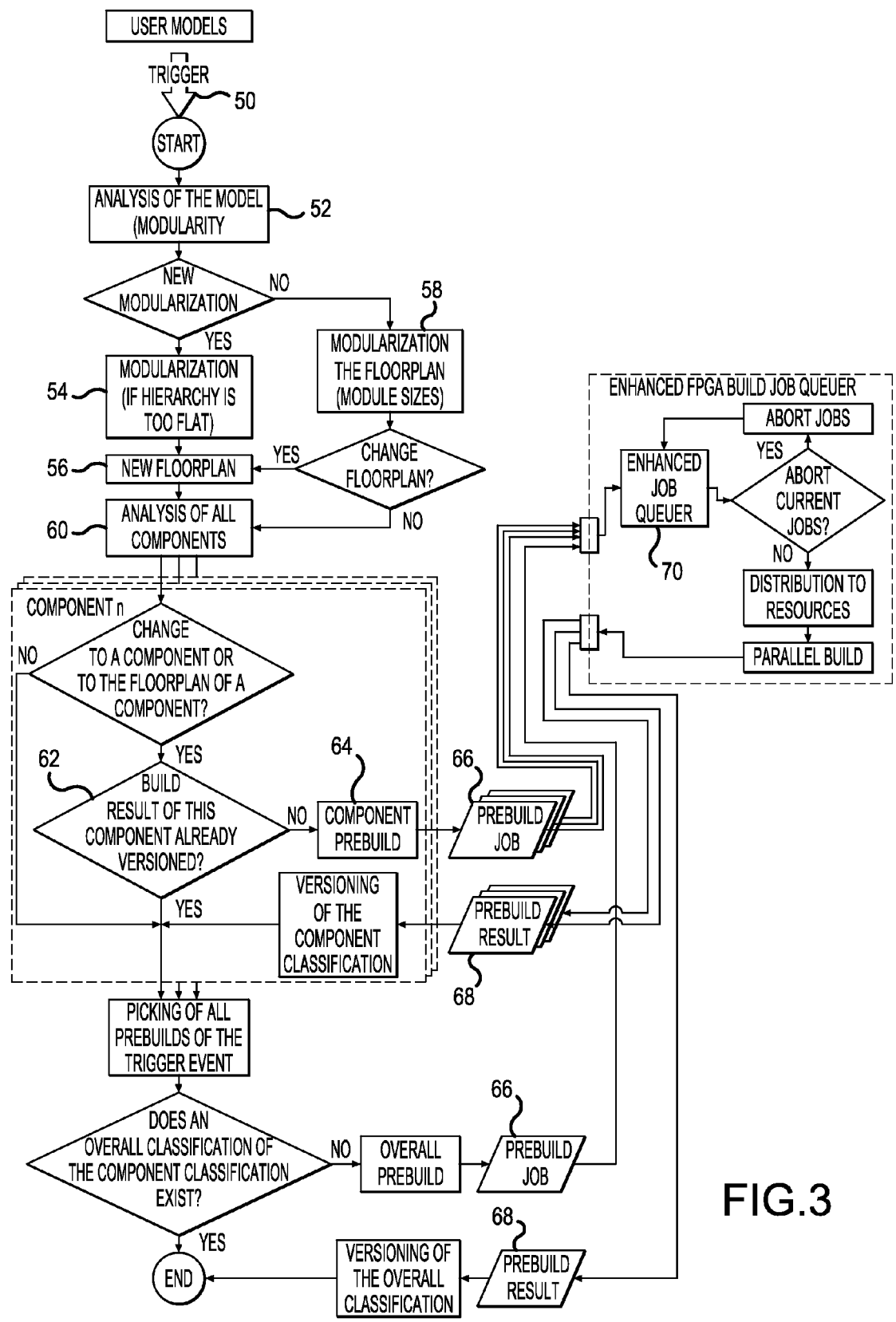
FIG. 3 shows an overview flowchart of an embodiment of the invention.

FIG. 3 shows a flowchart. The starting point is a trigger that occurs while the user is still modeling and the result is a complete FPGA overall classification. The overall process can be switched on and off by the user so that for example after completion of the development phase, the user can start a normal, complete build without floorplanning.

The process is started by a trigger 50 while the user is still modeling. A trigger 50 can, for example, be one of the following events:

The user saves his graphic model or his text source code. A classification of the modeling that is possibly worth keeping is achieved.

The user exits the scope of a subsystem in the graphic modeling tool. As a result, the fact is indicated that this subsystem has achieved a classification that is definitive for the time being.

The process is initiated automatically after a certain amount of time.

The FPGA build is explicitly initiated by the user. This case is known from the hierarchical tool flow.

After the trigger 50, the model/source code is first analyzed 52. The overall design of the FPGA may possibly have to be divided into useful individual components if this has not yet occurred. In this modularization 54, various strategies are possible, e.g. building similarly sized components so that changes to a component always result in similarly long build times and with a parallel build of a plurality of components, it is not necessary to wait long for a large component or for frequently changing components to be kept as small as possible since the changing of them does not have an excessively negative impact on a new build. A frequently changing component can be recognized during the modeling not only by the number of actual changes, but also possibly by the number indicating how often a user enters and exits a graphic subsystem. With a new modularization, a new floorplan 56 is also necessary. In this case, though, it should always be noted that for a particular modularization and a corresponding floorplan, implemented components may already exist so it may not be possible to continue using these in the event of a new modularization and therefore also a new floorplanning. Corresponding evaluation functions are needed. When changes to the components are made, a new floorplan can become necessary even without a new modularization if an analysis of the component sizes 58 indicates that components no longer fit in their partitions.

The floorplan corresponds to the mapping of logical components to FPGA gate arrays. Therefore, each floorplan represents adaptable and/or implemented hardware logic equivalent to an integrated circuit. In the present arrangement, implemented logic in the form of programmed/hard-coded gates can be tested and updated before adding the next component. The process retains components which need not be changed and updates those which require modification to fit the new floorplan. Therefore, each pre-build process disclosed can be at least partially implemented in hardware logic while the rest is being built, written to memory or developed.

A modularization and a floorplan can also be specified by the user. The user can also assist a new modularization and a new floor-planning.

The individual components are then analyzed 60 as to whether a prebuild already exists for the current version and the associated partition of the floorplan. If this is not the case, then a prebuild job is assigned, which is distributed by the enhanced job queuer. If prebuilds exist for all of the components, then an overall prebuild is created. The pre-build events of the individual components and of the overall classification are versioned so that it is possible to access prior versions as needed.

Basically, the design can exist in various abstract forms, as described below:

Graphic Model

The model may possibly already exist in the form of graphically recognizable subsystems, which directly serve as components and do not have to be divided further. In the case of a graphic model, if an excessively flat hierarchy is specified, then an automatically generated, modularized, consistent copy can be maintained in the background, which serves as a basis for the versioning and the prebuild of the components. Alternatively, HDL code can first be generated from the model and a modularization can be carried out on the basis of it.

Source Code-Based Approach/RTL (Register Transfer Level)

If the design is already in a hardware description language (e.g. VHDL, Verilog) in the form of various components with definite interfaces/entities, then this modularization can be maintained or a restructuring that is more favorable for the approach is carried out, for example the hierarchy is made flatter or deeper. Also for this purpose, an automatically generated, modularized, consistent copy can be maintained in the background, which serves as a basis for the versioning and the prebuild of the components. The implementation can, for example, be carried out by establishing a graph or hypergraph on the RTL in order to identify relevant components.

Netlist-Based Approach

The FPGA synthesis translates the hardware description language into netlists. If the FPGA model is in the form of a netlist, then among other things, graph-based or hypergraph-based methods can be used for dividing the design. The partitioning of graphs makes it possible to automatically identify components that exist as autonomously as possible, without a lot of interconnections to other components.

Figure 4:
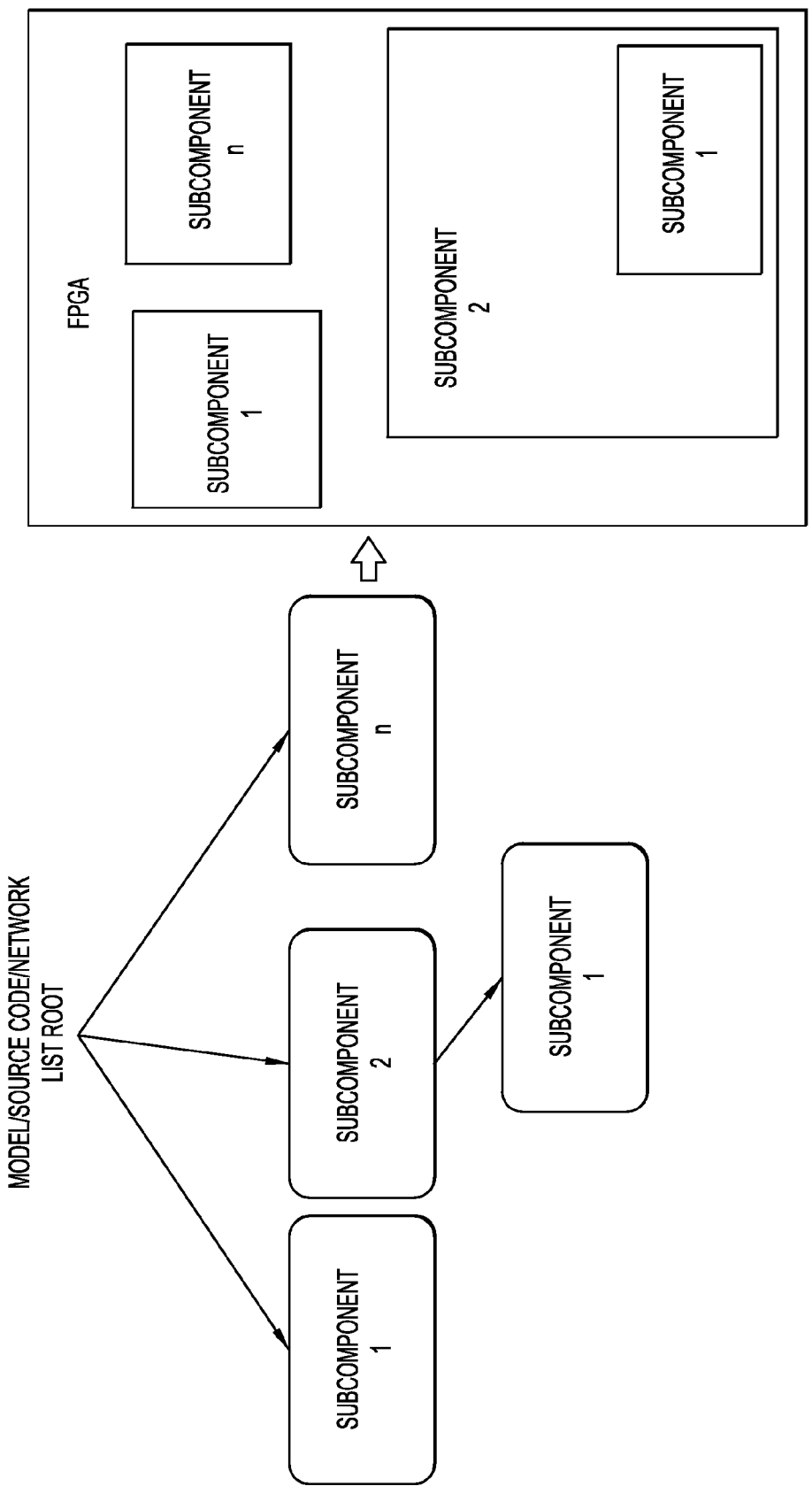
FIG. 4 shows a modularization of a model of an FPGA program into components and a reservation of areas for these components in the form of a floorplan in the FPGA.

FIG. 4 shows an example of the modularization of models, source code, or netlists into components. By means of the automatic floorplanning, corresponding areas in the FPGA are reserved for the individual components. The model exists in the form of a graphic model, source code, or a netlist and is hierarchically divided into a plurality of subcomponents, which may possibly contain other sub-subcomponents. An area in the FPGA is reserved for each subcomponent.

The estimate of the resource demand of a component is the prerequisite for the creation of a correct floorplan. This may possibly also play a role even in the modularization. In addition to the actual resource demand of the component, other parameters can also influence the area to be reserved in the FPGA, for example if a component is manually or automatically attributed as still growing, then more FPGA area and thus more resources are provided for the component; consequently, it is not necessary to create a new floorplan immediately if the resource demand of a component increases. Alternatively, more space can also be reserved for a frequently changing component since in this case, the chances are high that it is also still growing.

A resource/area estimate can be implemented in various ways. A few possibilities for determining the resource demand will be described below.

Evaluation of the resource demand based on synthesis reports/synthesis results. As a rule, a synthesis is completed quickly and therefore supplies quick and realistic results for the resource demand.

The cumulative demand of a component is determined using lookup tables that specify the resource demand of individual elements.

Evaluation of the resource demand of implementation reports/implementation results. To this end, the implementation results of the last build of a component, for example, can be used in order to optimize the area to be reserved for the next build. It is possible, for example, to make fewer unnecessary space reservations for the component in the floorplan.

The resource demand of a component is not absolutely proportional to the required area. In the event of nonhomogeneous resource distribution in the FPGA or special resource demand, e.g. with significant use of elements such as DSP slices or block RAMs, it is necessary to take into account the fact that the available area can be disproportionately greater than the designated resource demand and also contains the required resources.

After the user design by means of modularization 54 has been divided into components, a floorplan 56 must be created. To that end, an area in the FPGA must be found that includes all of the necessary resources of the component and this must be suitably placed on the FPGA. In this case, a distinction is drawn between the initial placement, i.e. the initial floorplan for which a completely new floorplan is drafted, and the new placement of components. With the new placement, the existing floorplan is kept in large pieces if possible in order to be able to continue using completed component classifications. The floorplanning can occur automatically, in a user-assisted fashion, or manually by means of user input.

When creating the floorplan, it is necessary to take into account factors such as the resource demand of the components, the resource distribution on the FPGA, and the relationship of the components to one another. The resource demand and the relationships of the individual components to one another are already known in the RTL and netlist level. The resource distribution is established as a function of architecture.

A placement of the components close to the required resources is particularly desirable with heterogeneous resource availability.

The initial placement of the components can be purely random. It is, however, advantageous to connect it with certain constraints.

The reservation of space for a component generally occurs in rectangular sections on the generally rectangular area of the FPGA. The optimal distribution of rectangles within a rectangle is an NP-complete decision problem that falls under the rubric of "2D bin packing." This approach is conceivable for the initial placement, but it does not take into account the relationship of the components to one another and the sometimes heterogeneous resource distribution.

There are a large number of possible approaches. A circle-based approach, which can be favorably combined with a region growing method, will be discussed further below.

In the "Analysis of the floorplan" step 58, an adaptation of the floorplan can occur for various reasons.

Figure 5:
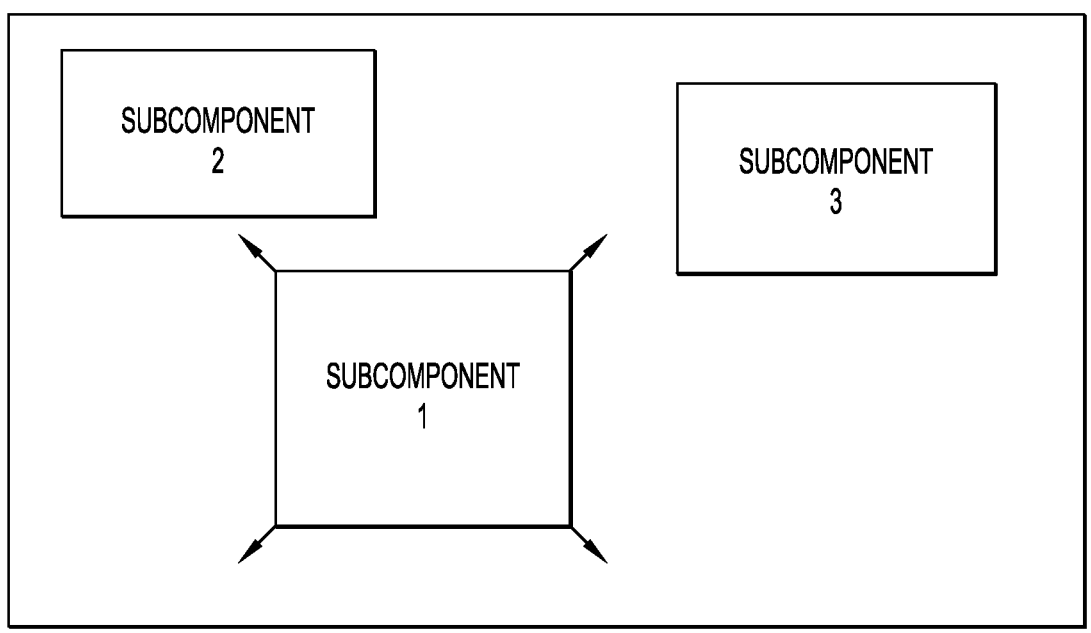
FIG. 5 shows the rebuild of an individual component with an optional enlargement.
Figure 6:
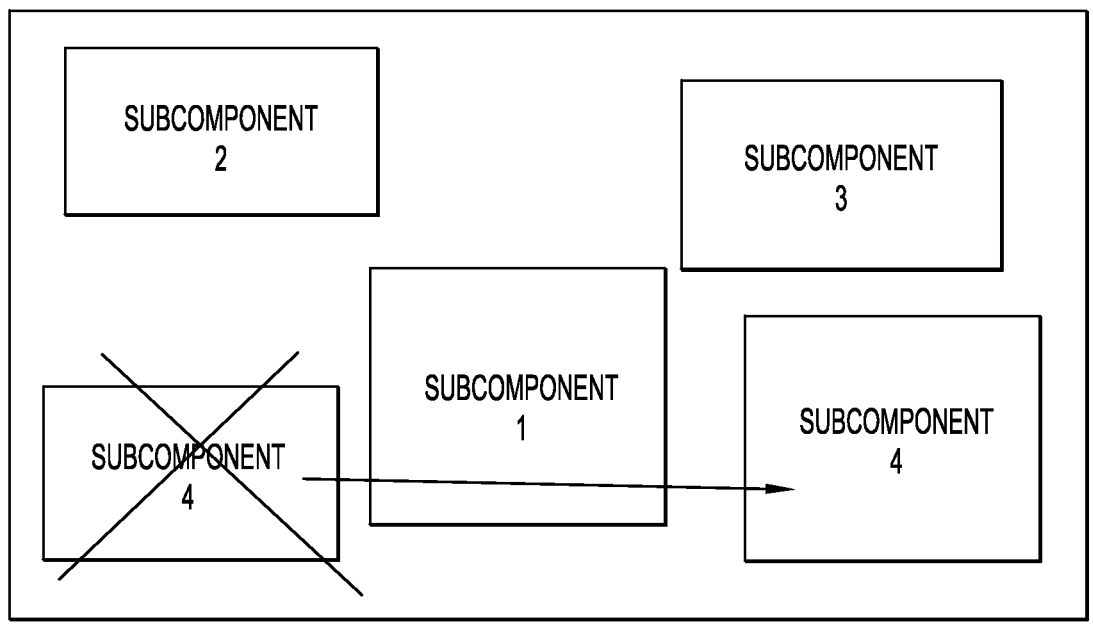
FIG. 6 shows the rebuild of an individual component with a new placement on the FPGA.
Figure 7:
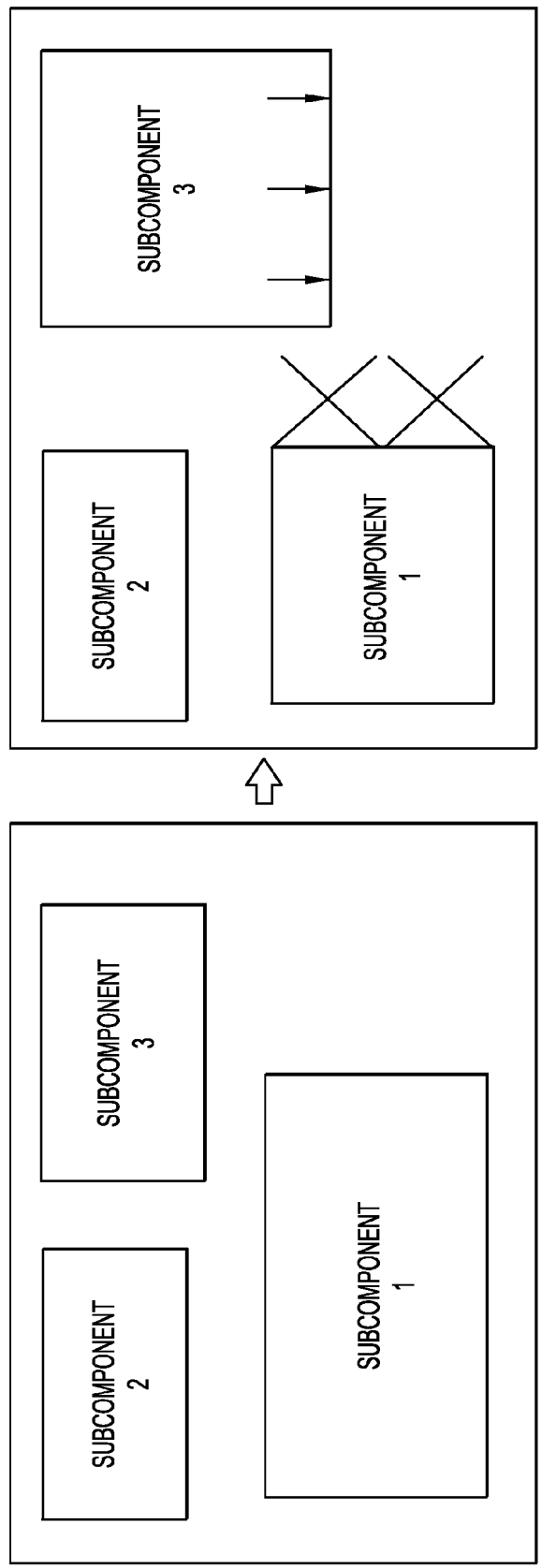
FIG. 7 shows the rebuild of an individual component with region growing.
Figure 8:
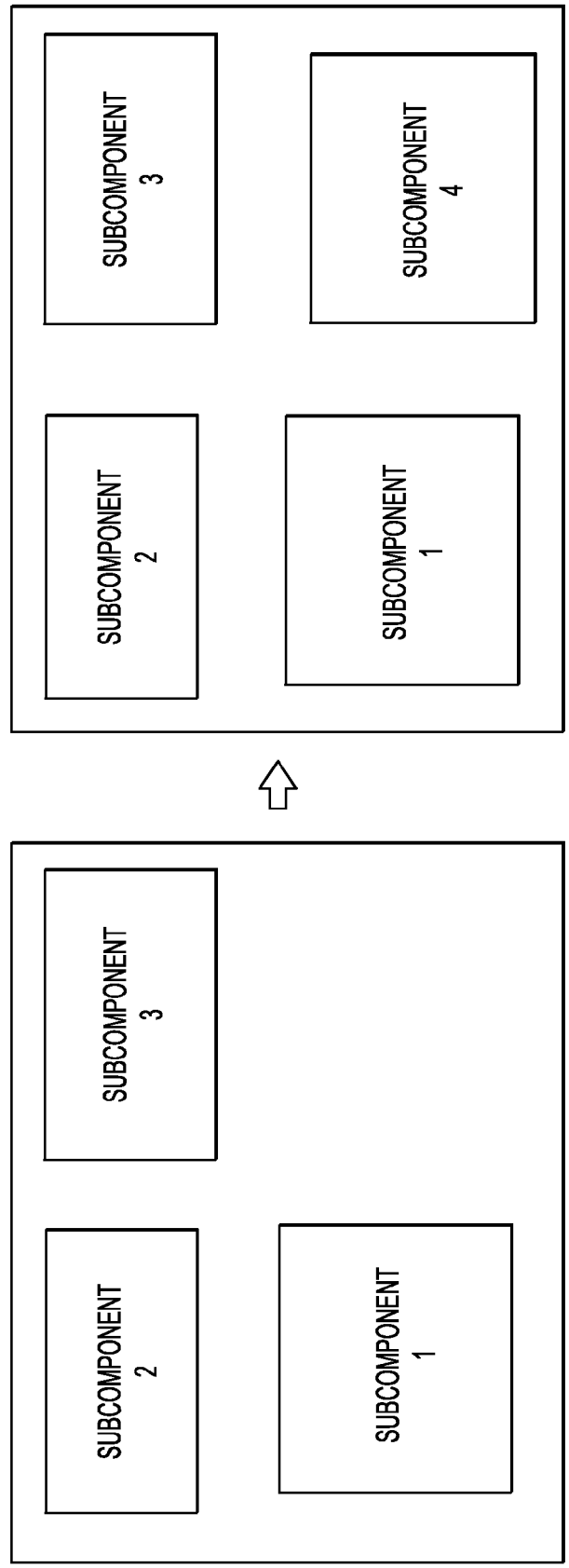
FIG. 8 shows the insertion of a new component.

For example, the following method is suitable for the placement when changes have occurred in the resource demand of components:

Rectangular components
  Are scaled in one or two dimensions and possibly shifted and implemented in order to meet the new resource demand. This is shown in FIG. 5.
  Are redimensioned, placed, and implemented if the space required is no longer sufficient. This is shown in FIG. 6.
  If free placement is also no longer possible, then
    A plurality of components must be newly placed and implemented
    All of the components must once again be initially placed and implemented
"Region growing" approach
  Growing or shrinking of changed components by means of "region growing" or "region shrinking". This is shown in FIG. 7.
  If free placement is also no longer possible, then
    A plurality of components must be newly placed and implemented
    Or all of the components must once again be initially placed and implemented
For the new placement of a component:
  If there is still enough free space, then a new region is reserved for the component. An example that is independent of the placement method is shown in FIG. 8.
  If free placement is no longer possible, then
    A plurality of components must be newly placed and implemented
    All of the components must once again be initially placed and implemented A change in the relationship of components to one another, e.g. due to changed signal constraints, can result in a new placement of the components.

According to the overview diagram in FIG. 3, an analysis 60 of all of the components takes place after the floorplanning. For each individual component, this analysis checks whether it has been given a different position or size in the current floorplan. If this is the case, then first a check is performed as to whether an appropriately versioned classification of these components exists 62 or whether a prebuild of the component must be initiated 64.

The prebuild mechanism ensures that prebuild jobs 66 are initiated for changed components. In addition to the prebuild jobs 66, additional prebuild jobs 66 integrate the individual components into an FPGA overall classification in the background. Since only a small subregion in this overall classification ever changes and the rest is locked, it takes significantly less time to generate a new overall classification.

All of the jobs that accrue can be distributed more efficiently by means of an enhanced FPGA build job queuer 70, which possibly has access to a plurality of processor cores, an FPGA build farm, or an FPGA build cloud.

If partial bit streams to the components also exist, then these can be used as needed for partial reconfiguration. The customer therefore has the option of updating subcomponents online while the FPGA is running. Various classifications of components and the interaction of different components with one another can thus be quickly evaluated.

In addition to a changed component version, there are still other criteria that could require a new prebuild. Important examples of these include, among other things, the criteria of size, placement, and distances.
  1. Pre-build because a build of the component does not yet exist
  2. Pre-build because the component will be in the way of another new/grown component and a new floorplan has been created.
  3. Pre-build for reduced-size regions since other components are currently growing more rapidly and a new floorplan has been created.
  4. Pre-build for a component for a newly allocated area in the FPGA.
  5. Pre-build when there are changed constraints if a new arrangement of the components is necessary because of new timing constraints.

In an exemplary embodiment of the invention, there is an automated versioning of the individual components and the overall classifications. In the analysis of all of the components, a determination is made as to whether individual components or their floorplans have been changed. If this is the case, then next, a determination is automatically carried out as to whether the current classification of the component corresponds to a classification that has already been versioned before. This can take place either by directly comparing the model/source code to all versioned classifications of the component or by comparing, for example, a hash value of a component. With the direct comparison or for example when a hash value is produced, irrelevant components such as comments can optionally be ignored.

If a versioned classification of the component already exists, then this is used, thus saving the labor-intensive build process of the component. This is often the case when the customer cancels a modification again at some point in the model/source code.

If a versioned classification does not yet exist, then the component is automatically rebuilt in the background by means of a prebuild job 66. The result of the prebuild 68, versioned together with the classification of the component, is then saved.

It is also possible for an explicit selection of a component version to be made by the user who wishes to return to an old version or an externally supplied version.

If all of the prebuilds are available after a trigger event 50, then first a check is performed as to whether a versioned overall classification already exists for this combination of component classifications. If so, then it can be used. If not, then a prebuild job 66 is initiated for the overall classification. To this end, an existing overall classification is used that conforms the most closely to the required one; for example if there is already an overall classification that has already implemented 3 out of 4 required components, then only one component has to be updated. The result of the prebuild job 66 supplies the current overall classification, which is versioned again, together with the information about the component versions used.

When a component is being versioned, all relevant data of the corresponding version are stored in a centralized or decentralized fashion. This includes the following: the complete component and/or hash value regarding the component. The use of a hash value saves space and hash values can be equalized more quickly than complete components; the build result 68 of the component; and/or the date and version of the component and possibly other metadata.

When an overall classification is being versioned, all relevant data of the corresponding version are stored in a centralized or decentralized fashion. This includes the following: information about the component versions used and if need be also the complete components in the corresponding versions; the build result 68 of the overall classification; and/or the date and version of the overall classification and possibly other metadata.

The build result containing the versioned components and classifications is then stored in memory in the form of an array of logic blocks corresponding to an FPGA logic array. Alternatively, a look-up table to be hardcoded on an FPGA is stored in memory and adapted/changed with every rebuild. Alternatively, the look-up table or logic blocks are written to the FPGA and implemented as logic gates and interconnects. The incremental pre-builds would result in functional pieces of the FPGA logic array structure which could be tested before adding additional components.

The transfer of the built logic array to the FPGA results in an integrated circuit corresponding to the generated array of gates and/or a look-up table in non-volatile memory which dictates the FPGA logical functions and processes. The optimized floorplan maps the components and classification space allocated to the logic, inputs and constraints of the FPGA, where the FPGA can be a virtual implementation or a hardware implementation.

A job queuer 70 distributes build jobs 66 to various resources that are available to it. These can, for example, be free cores, a build farm, or also a build cloud. It is likewise possible for the job queuer 70 to perform a prioritization of build jobs 66. As a rule, automatically initiated prebuild jobs 66 are given a lower priority than build jobs that are initiated by the user. In addition, there can be prioritization criteria in which prebuild jobs can also be aborted again in order to free up resources for complete build jobs.

The enhanced FPGA build job queuer 70, as shown in FIG. 3, must perform tasks that go beyond those of a normal job queuer.

Since the number of available resources will always be limited, a situation can arise in which all of the build jobs compete with one another. This situation cannot be satisfactorily resolved merely through prioritization. For this reason, additional dependencies are introduced between jobs.

In an embodiment of the invention, dependencies are introduced between the build jobs 66 in addition to the priorities.

In an exemplary example: a first build job with a low priority is the prebuild of an already out-of-date classification of a component; a second build job with a low priority is the prebuild of a current classification of a component; and a third build job with a high priority is the build of a current overall classification In this case, the third build job is identified as being dependent on the second build job. Although the third build job has a higher priority than the second build job, the process first waits until the second build job has been executed before the third build job is started. In the event of a resource shortage, however, the first build job can be aborted since it has no current dependency on the third build job.

In addition to the dependency, the degree of completion is also evaluated; a job that is 90% complete, for example, will not generally be aborted. This is logical since it may possibly be another component classification that the user might also wish to test soon because the entirely up-to-date classification is not yet functional.

Often, high-quality FPGA tools are required for the build process of high-quality, large FPGAs. The availability of this resource is generally limited. The division of a design into subcomponents that place lower demands on the size and complexity of the FPGA can make it possible to distribute the prebuild jobs to resources with more advantageous FPGA tools, which are sufficient for these demands. Consequently the resources that are able to build high-quality, large FPGAs remain available for the compilation of a complete FPGA overall classification.

In summary, the enhanced FPGA build job queuer 70 performs the following tasks: distributing builds/prebuilds to resources; continuously evaluating build jobs, taking into account build job dependencies and degrees of completion; and/or starting and aborting builds/prebuilds The modularization, the automatic parallel prebuild, and the versioning of all results reduce the extremely lengthy process of the FPGA build to the replacement of small components in the FPGA. An up-to-date overall classification of the system that is currently in development can therefore be generated more quickly.

Figure 9:
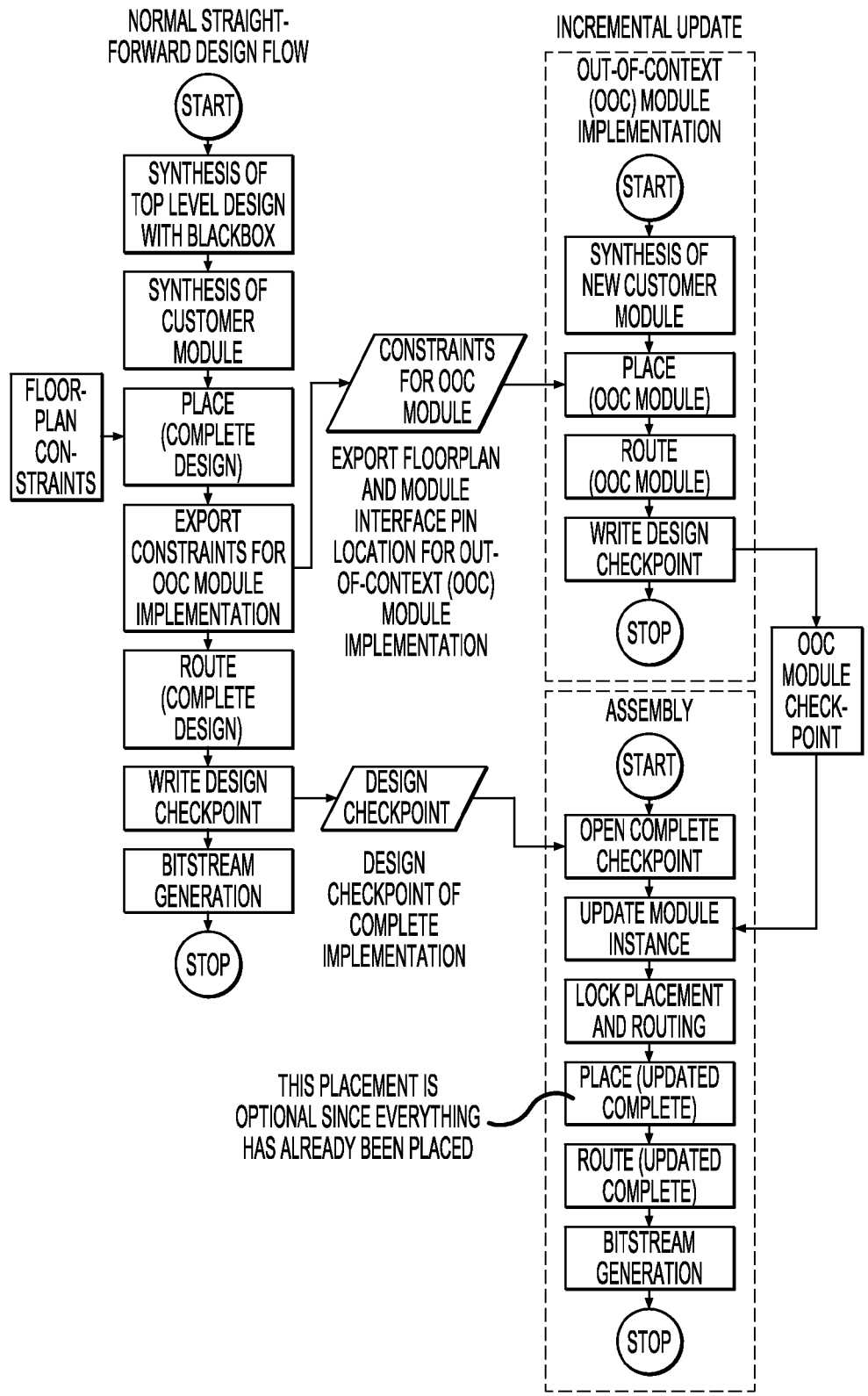
FIG. 9 shows a design flow of an embodiment of the invention.

FIG. 9 shows an example of the design flow of the invention in detail.

Figure 10:
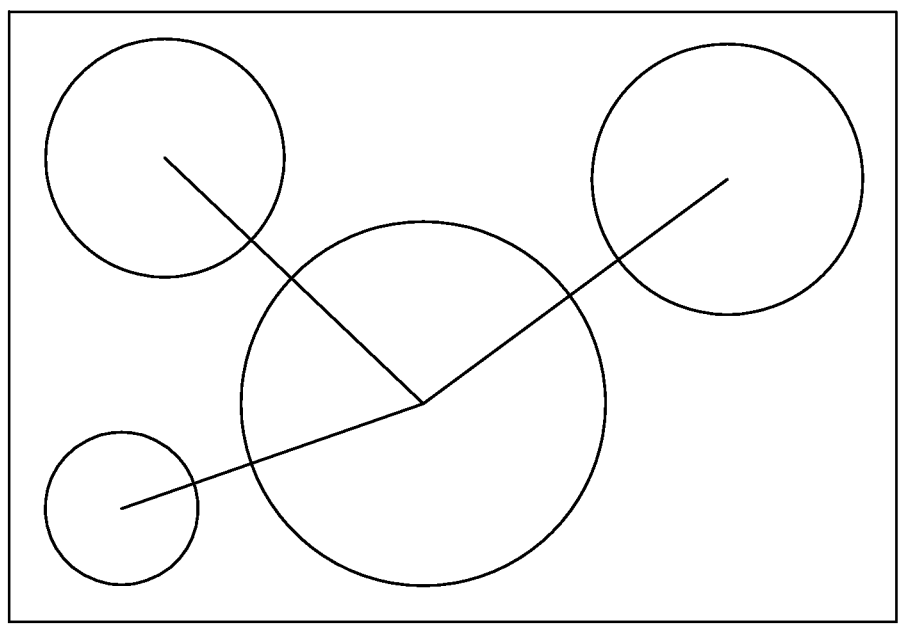
FIG. 10 shows a circle-based placement of the starting point of components with and without reserves on the FPGA.

One possible method of floorplanning with a circle-based placement approach is shown in FIG. 10 and is composed of the following steps:
1. The components are first represented by circles.
2. The area of a circle is proportional to the resource demand of the component.
3. Where necessary, the center points of the circles are located close to their required resources if the latter are heterogeneously distributed. They constitute the starting points of the components.
4. The distances of the center points of the circles from one another should be as proportional as possible to the relationship of the components to one another.
5. The circles should be placed inside a rectangle that represents the FPGA area.

Figure 11:
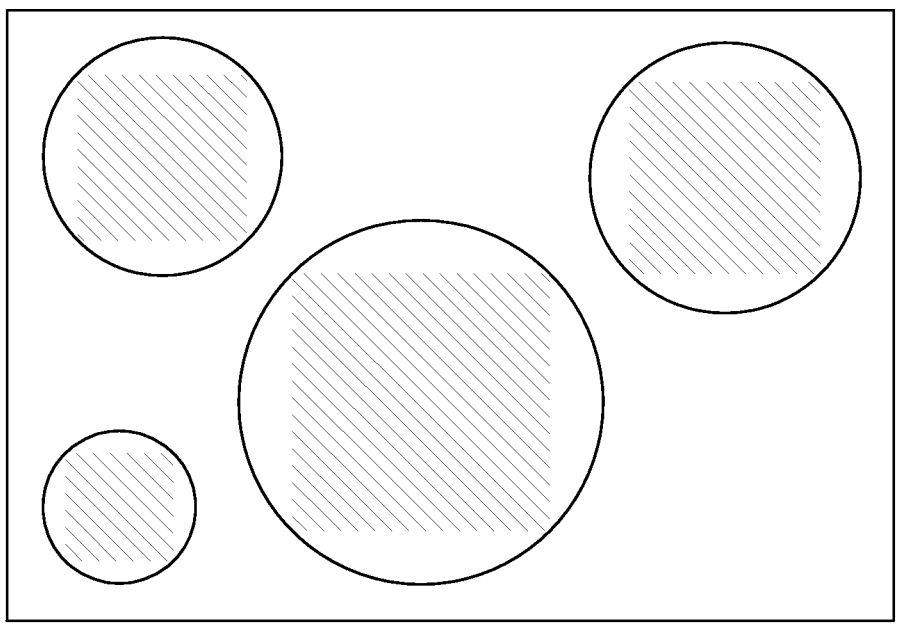
FIG. 11 shows an initial placement of the components on the FPGA in the form of a rectangle on the starting points.

The initial components, embodied in the form of rectangles of the required size, are placed onto their starting points. This is shown in FIG. 11.

In the "region growing" approach, starting from the starting point, the components grow iteratively in accordance with their constraints until a suitable rectangular size has been achieved. If permitted by the design tool, components from rectangular groups offer enormous potential here. One example for a placement according to the region growing approach is shown in FIGS. 12a-d.

Figure 12A:
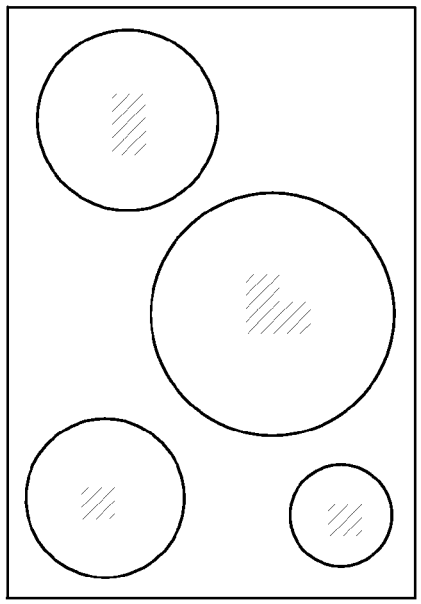
FIGS. 12a-12d show an initial placement of the components on the FPGA by means of region growing.
Figure 12B:
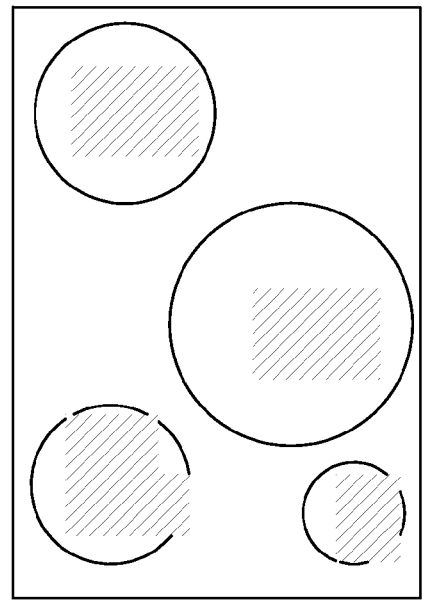
Figure 12C:
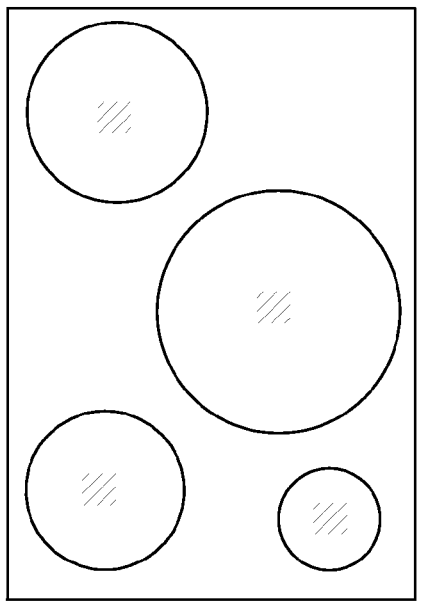
Figure 12D:
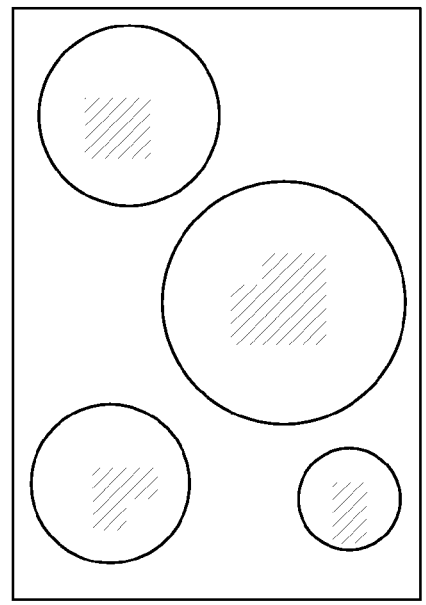

FIG. 12a shows that first, the respective rectangle situated the closest to the respective center point of the circle is reserved. FIGS. 12b-d show how rectangles adjoining the reserved region are iteratively reserved until the reserved area is large enough for the assigned component.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for generating a netlist of an FPGA program, an underlying model of the FPGA program being composed of at least two components, the method comprising:
   assigning each component a separate partition on the FPGA, wherein each component represents a logical circuit within an FPGA;
   performing an independent build of a netlist for each component, wherein the netlist represents wired interconnects between logical circuits in the FPGA;
   comparing a local classification of the netlist with versioned classifications of the components to determine if the versioned classifications are usable;
   generating an overall classification from the netlists of the components by incorporating the netlists directly into the overall classification;
   automatically starting the independent build after a trigger event, the trigger event being a saving of a component in a GUI, the exiting of a component of the model in the GUI, or a time-controlled, automated initiation of a build,
   wherein, if one of the versioned classifications is usable, then the versioned classification usable for a specific component of the at least two components is incorporated into the overall classification in place of the local classification or netlist, and
   generating a bit stream from the overall classification to configure a circuit configuration of the FPGA.

2. The method according to claim 1, wherein the completed built components are automatically versioned.

3. The method according to claim 1, wherein the model of the FPGA program is automatically divided into a plurality of components.

4. The method according to claim 1, wherein the FPGA is automatically divided into a number of partitions, which corresponds to the number of components of the model of the FPGA program.

5. The method according to claim 4, wherein the partitions provide a mapping of component logic to a logic gate array.

6. The method according to claim 1, wherein the components are automatically allocated to the partitions.

7. The method according to claim 1, wherein a first partition is reduced in size and a portion not needed by the built form of the component, which is allocated to the first partition, is allocated to a second partition.

8. The method according to claim 1, wherein a third partition and a fourth partition are combined to form a fifth partition and the components allocated to the third partition and fourth partition are combined.

9. The method according to claim 1, wherein an overall classification is automatically built as soon as netlists of all components of the model of the FPGA program are available in a routed form.

10. The method according to claim 1, wherein, if an overall classification is already available when a change is made to a component, then the changed component is updated in the overall classification when a new overall classification is built.

11. The method according to claim 1, wherein the completed built overall classifications are automatically versioned.

12. The method according to claim 1, wherein the build jobs are managed by a job queuer.

13. The method according to claim 1, wherein a bit stream for the configuration of the FPGA is produced from the netlists of the components and/or from a netlist of an overall classification.

14. A development environment for a netlist of an FPGA program, wherein the FPGA program automatically carries out the method according to claim 1.

15. The method according to claim 1, wherein a build of the component converts the FPGA program to a plurality of FPGA logic gates and interconnects.

16. The method according to claim 1, wherein the local classification is compared to versioned classifications based on a hash value of each component.

17. The method according to claim 1, wherein the local classification is compared to versioned classifications based on source code for each component.

18. The method according to claim 1, wherein the prebuilt version is compared to the previously versioned classification based on source code for each component.

19. The method according to claim 1, further comprising:
   editing at least one versioned component after the overall classification is built;
   generating a local classification for the at least one versioned component edited after the overall classification is built;
   verifying that the local classification of each of the at least one versioned component can replace the previously versioned classification of the at least one versioned component; and
   replacing the previously versioned classification in the overall classification with the local classification.

20. A method of building an FPGA circuit layout, comprising:
   pre-building at least two components of an FPGA program into at least two partial models;
   versioning each prebuilt component, wherein each component represents a logical circuit within an FPGA;
   determining if a prebuilt version exists as a previously versioned classification;
   if the prebuilt version was previously versioned, selecting the previously versioned classification for incorporation into a final build;
   if the prebuilt version was not previously versioned, selecting the prebuilt component for incorporation into the final build;
   generating at least one netlist for the partial models, wherein each netlist represents a wired interconnect between logical circuits in the FPGA;
   generating an overall classification from each netlist of each component or the previously versioned classification of each component; and
   generating a bit stream from the overall classification to configure a for circuit configuration of the FPGA.

21. The method according to claim 20, wherein the prebuilt version is compared to the previously versioned classification based on a hash value of each component.

\* \* \* \* \*